United States Patent [19]

Buchholz et al.

[11] Patent Number: 5,215,244

[45] Date of Patent: Jun. 1, 1993

[54] METHOD OF MOUNTING SILICON WAFERS ON METALLIC MOUNTING SURFACES

[75] Inventors: Juergen Buchholz, Lauffen; Hans-Peter Trah, Reutlingen; Wolfgang Klucken, Gomaringen, all of Fed. Rep. of Germany

[73] Assignee: Robert Bosch GmbH, Stuttgart, Fed. Rep. of Germany

[21] Appl. No.: 840,327

[22] Filed: Feb. 24, 1992

[30] Foreign Application Priority Data

Mar. 9, 1991 [DE] Fed. Rep. of Germany ....... 4107660

[51] Int. Cl.$^5$ ............................................. B23K 31/02
[52] U.S. Cl. .................................. 228/122; 228/124; 228/175; 228/189
[58] Field of Search ............................... 228/121-124, 228/175, 189, 263.12

[56] References Cited

U.S. PATENT DOCUMENTS

| | | | |
|---|---|---|---|
| 3,031,747 | 5/1962 | Green | 228/123 |
| 3,729,807 | 5/1973 | Fujiwara | 228/123 |
| 3,860,949 | 1/1975 | Stoeckert et al. | 357/65 |
| 4,005,454 | 1/1977 | Froloff et al. | 357/65 |
| 4,019,388 | 4/1977 | Hall, II et al. | 228/124 |
| 4,023,725 | 5/1977 | Ivett et al. | 228/123 |
| 4,152,540 | 5/1979 | Duncan et al. | 228/122 |
| 4,181,249 | 1/1980 | Peterson et al. | 228/123 |
| 4,341,816 | 7/1982 | Lauterbach et al. | 427/34 |
| 4,647,013 | 3/1987 | Giachino et al. | 251/331 |
| 4,661,835 | 4/1987 | Gademann et al. | 357/68 |
| 4,772,935 | 9/1988 | Lawler et al. | 228/124 |
| 5,027,997 | 7/1991 | Bendik et al. | 228/123 |
| 5,037,778 | 8/1991 | Stark et al. | 228/123 |

FOREIGN PATENT DOCUMENTS

| | | |
|---|---|---|
| 2215526 | 10/1973 | Fed. Rep. of Germany . |
| 2930779 | 2/1980 | Fed. Rep. of Germany . |
| 3401404 | 7/1985 | Fed. Rep. of Germany . |
| 2238267 | 5/1991 | United Kingdom . |

OTHER PUBLICATIONS

R. K. Shukla, "A Critical Review of VLSI Die-Attachment in High Reliability Applications" in Solid State Technology, Jul. 1985, pp. 67-74.
Carpenter Technology Corporation, "Kovar Alloy", 3 page data sheet, dated Oct. 1990.
Taylor Lyman, "Metals Handbook", 1948 Edition, p. 604.

*Primary Examiner*—Samuel M. Heinrich
*Attorney, Agent, or Firm*—Frishauf, Holtz, Goodman & Woodward

[57] ABSTRACT

A method of mounting a semiconductor wafer (10) on a metallic mounting surface, particularly during manufacture of valves with macromechanical valve bodies (20), features the steps of applying a metallization (11) to at least one major surface of the semiconductor wafer, and thereafter soldering the thus-metallized major surface, either wholly or in localized surface areas, to the metallic mounting surface.

8 Claims, 2 Drawing Sheets

METHOD OF MOUNTING SILICON WAFERS ON METALLIC MOUNTING SURFACES

CROSS-REFERENCE TO RELATED PATENT AND APPLICATION, THE DISCLOSURES OF WHICH ARE HEREBY INCORPORATED BY REFERENCE

U.S. Pat. No. 4,647,013, GIACHINO & KRESS/FORD, Mar. 3, 1987, entitled SILICON VALVE;

U.S. Ser. No. 07/756,490, GERSTNER et al.-/BOSCH, Sep. 9, 1991.

FIELD OF THE INVENTION

The present invention relates generally to methods of mounting semiconductor wafers on a metallic surface and, more particularly, to an improved method of securing silicon wafers used in making valves, such as those used in fuel injection.

BACKGROUND

From U.S. Pat. No. 4,647,013, it is known to use, in combination with a macromechanical valve body, structured silicon wafers which are components of a micromechanical valve. FIGS. 12 and 15 of this disclosure indicate that the silicon wafers 81, 152 are clamped against the valve body.

The method of the present invention for mounting of silicon wafers on metallic mounting surfaces represents an advantageous possibility for coupling of micromechanical silicon structures, e.g. aperture plates or valves, to valve bodies made according to classical precision mechanical manufacturing methods.

THE INVENTION

It is an object of the present invention to secure a semiconductor, e.g. silicon, element to a metal element, such as a valve body, preferably in a way that facilitates proper alignment and minimizes problems arising from differing thermal coefficients of expansion. Soldering is more secure than clamping, but sometimes solder does not stick to silicon well.

Accordingly, in the method of the present invention, a metal coating is first applied to the silicon, and the metal coating is then soldered to the metal valve body, which results in a more permanent solder bond.

Another advantageous feature is the use of an intermediate element, through which the silicon wafer is secured to the valve body. It is desirable to select, as the material for the intermediate element, one whose thermal coefficient of expansion is compatible with the coefficients of the silicon wafer and of the valve body. The intermediate element can thus "buffer" any differences in the coefficients of the silicon and of the metal. A particularly tension-free or stress-free assembly can be achieved using a deep-drawn or otherwise curved element which serves to clamp the silicon wafer against the valve body. The silicon wafer is preferably soldered to the intermediate element, and the element is subsequently secured to the valve body in a region surrounding the silicon wafer. The resulting arrangement is that the silicon wafer is fixed with respect to the valve body, yet not directly connected. This can, for example, keep an aperture in the wafer aligned with the center of a passage or conduit formed in the valve.

DRAWINGS

DETAILED DESCRIPTION

Figure 1:
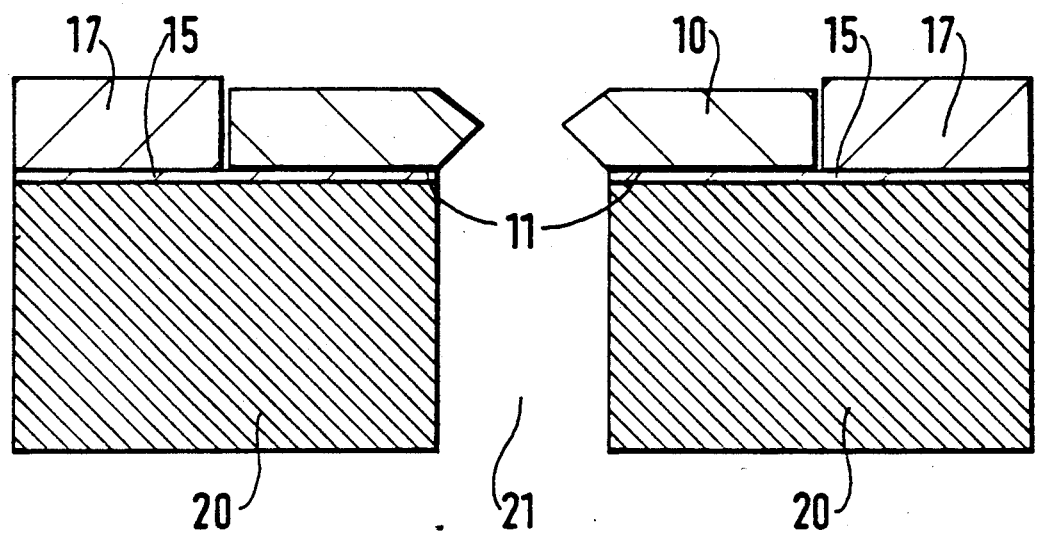
FIGS. 1 and 2 illustrate silicon wafers directly connected to a valve body.

In FIG. 1, a valve body 20 is formed with a central bore 21. This valve body is conventionally made from metal by precision mechanical methods, but may also be made from another material, for example plastic. The significant feature is that valve body 20 has a metallic mounting surface, onto which a silicon wafer 10 is to be secured. In this and all following examples, silicon wafer 10 is structured, and serves as aperture plate in the valve structure. The method of the invention is, however, also usable for silicon wafers with other structures and functions. Silicon wafer 10 has, on its major surface adjacent valve body 20, a metal coating or layer 11. This metal coating 11 can be, for example, chromium, nickel, or gold, applied by any of several conventional methods, such as vapor deposition. This metallized major surface of wafer 10 is soldered to the metallic mounting surface of the valve body. A solder layer 15 is thereby created between silicon wafer 10 and valve body 20. In the example shown in FIG. 1, a solder frame 17 is placed on the surface of valve body 20. This solder frame 17 serves as a positioning aid for silicon wafer 10, which is justified with valve body 20 before connection, in order that the aperture of silicon wafer 10 and bore 21 in valve body 20 will be centrally aligned with respect to each other.

Figure 2:
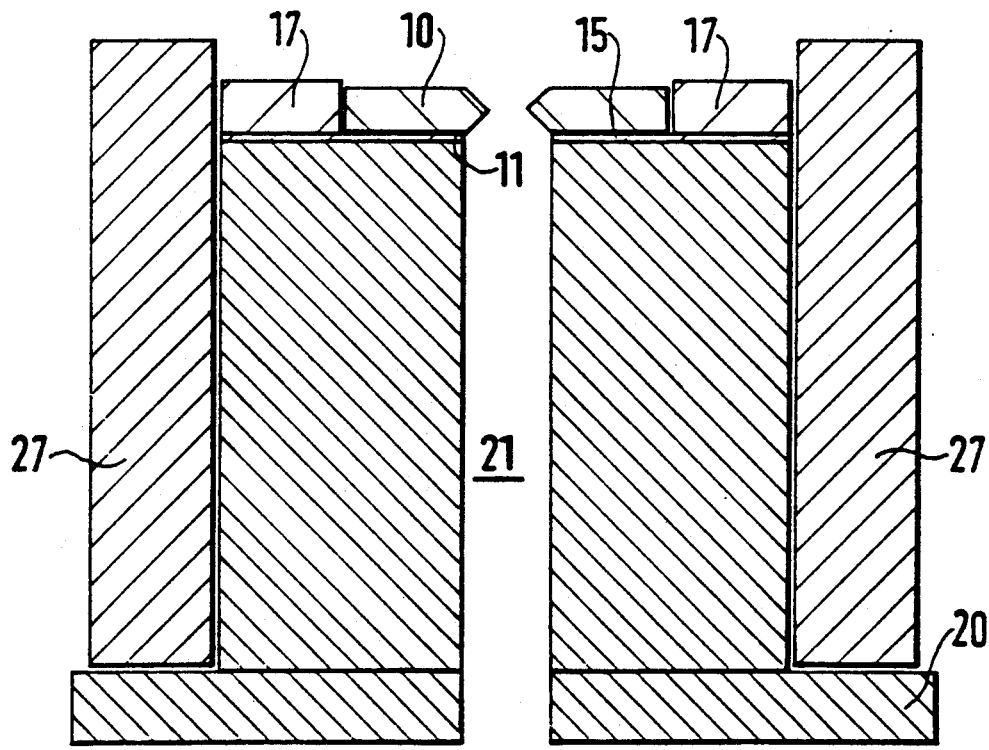

FIG. 2 represents a valve structure as in FIG. 1, but with an additional positioning aid, consisting of a casing 27 of valve body 20. Casing 27 projects outward from the mounting surface of valve body 20, so that solder frame 17 can be simply fitted or applied inside the perimeter defined by casing 27. Casing 27 can be, for example, a small aluminum tube.

Figure 3:
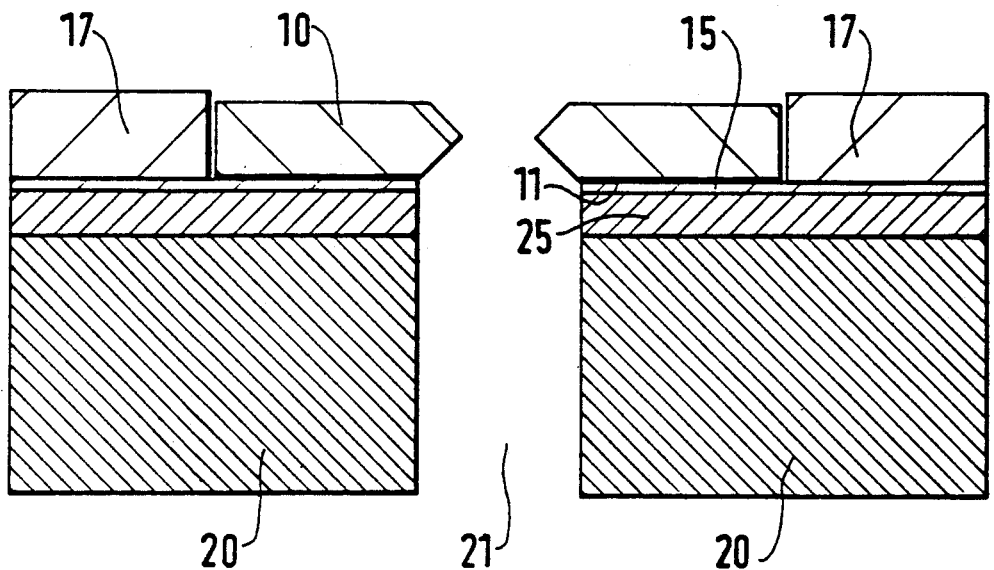
FIGS. 3 and 4 illustrate alternative implementations of assembly of silicon wafers to a valve body using an intermediate element.

For the structure shown in FIG. 3, silicon wafer 10 was initially soldered, with its metallized major surface, against the metallic mounting surface of an intermediate element 25.

A solder frame 17, for positioning of silicon wafer 10, is applied to intermediate carrier or element 25. Thereafter, intermediate element 25 is secured to valve body 20, which can be accomplished by, for example, laser welding of local areas. Preferably, the material of intermediate element 25 is so chosen that, in the event of temperature fluctuations, element 25 mediates any differences in thermal expansion/contraction coefficients of silicon wafer 10 and valve body 20, and thus minimizes mechanical stresses between silicon wafer 10 and valve body 20. For example, if valve body 20 is steel, a suitable "buffer" or intermediate element 25 is the material sold under the trademark KOVAR (U.S. TM Reg. No. 337,962 of Carpenter Technology Corp., Reading, Pa., for an alloy containing about 54% iron, 28% nickel and 18% cobalt).

Figure 4:
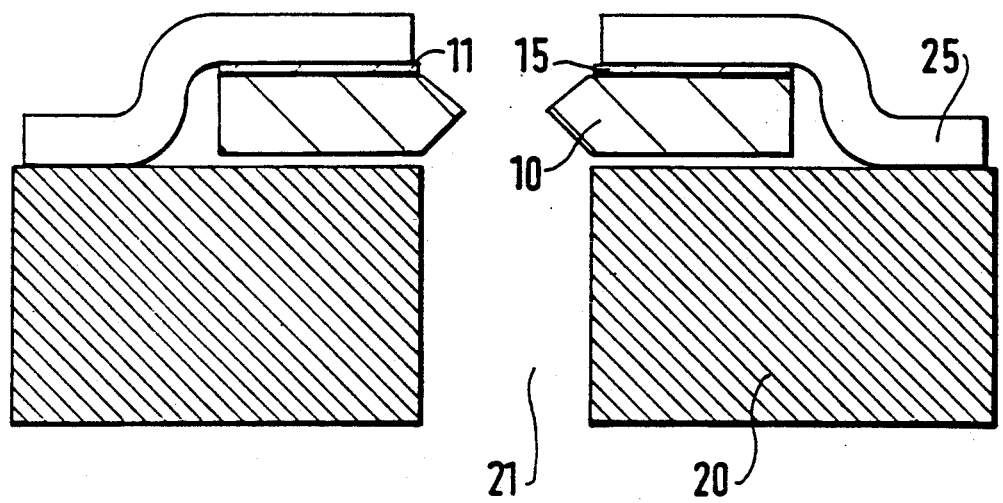

The structure shown in FIG. 4 also has an intermediate element 25' but, in contrast to the planar intermediate element 25 of FIG. 3, this element 25' is domed or bowed over the valve body. The metallized major surface of silicon wafer 10 faces away from valve body 20, and the metallized surface is soldered to the undersurface of element 25', that is, to another portion of the same surface of element 25' which faces valve body 20.

Element 25' is then connected to valve body 20 in a region surrounding silicon wafer 10. Thus, silicon wafer 10 is arranged between valve body 20 and intermediate element 25', and is secured to element 25' but not directly to valve body 20. Due to the connection of element 25' to valve body 20, the position of silicon wafer 10 and its aperture, with respect to valve body 20 and its bore 31, is fixed. This structure is particularly stress-free, since no direct, fixed connection exists between silicon wafer 10 and valve body 20, but rather only an indirect connection via element 25'. No harm arises if a steel valve body expands more, in response to a temperature rise, than silicon wafer 20 expands.

In all the above-described examples, the solder connection between silicon wafer 10 and the metallic mounting surface can be either over the entire surface or in localized areas, as appropriate.

We claim:

1. Method of mounting a semiconductor wafer (10) on a metallic mounting surface of a valve body (20), comprising the steps of
    applying a metallization (11) to at least one major surface of said semiconductor wafer (10); and
    soldering the thus-metallized major surface directly to said metallic mounting surface of said valve body (20).

2. Method according to claim 1,
    wherein said applying step comprises applying a metal selected from the group consisting of chromium, nickel and gold.

3. Method according to claim 1, further comprising prior to said soldering step,
    applying a positioning aid (17, 27) to said metallic mounting surface, and
    using said positioning aid to align an aperture formed in said silicon wafer with respect to an aperture formed in said metallic mounting surface of said body.

4. Method of mounting a semiconductor wafer (10) on a metallic mounting surface of a valve body (20), comprising the steps of
    applying a metallization (11) to at least one major surface of said semiconductor wafer (10);
    soldering the thus-metallized major surface to a mounting surface of an intermediate element (25'); and
    securing said intermediate element (25') to said valve body (20).

5. Method according to claim 4, wherein said intermediate element (25') is secured by laser welding to said valve body.

6. Method according to claim 4, wherein said intermediate element (25) is generally planar and forms a layer intermediate said valve body (20) and said wafer (10).

7. Method according to claim 4, wherein
    said intermediate element (25') has first and second major surfaces, and is both soldered to said wafer (10) by said first major surface and secured to said valve body (20) by said first major surface, thereby securing said wafer (10) in position between said element (25') and said valve body (20) without directly connecting said wafer to said valve body.

8. Method according to claim 5, wherein said applying step comprises applying a metal selected from the group consisting of chromium, nickel and gold.

* * * * *